March 19, 1957 W. V. TYMINSKI ET AL 2,786,142

ELECTRICAL TUNING DEVICE

Filed Nov. 19, 1952 2 Sheets-Sheet 1

INVENTORS.
WALTER V. TYMINSKI
BY ALBERT E. HYLAS

Darby & Darby
ATTORNEYS

ELECTRICAL TUNING DEVICE

Filed Nov. 19, 1952 2 Sheets-Sheet 2

INVENTORS.
WALTER V. TYMINSKI
ALBERT E. HYLAS
BY
Darby & Darby
ATTORNEYS

United States Patent Office 2,786,142

Patented Mar. 19, 1957

2,786,142

ELECTRICAL TUNING DEVICE

Walter V. Tyminski, Nutley, and Albert E. Hylas, Clifton, N. J., assignors to Allen B. Du Mont Laboratories, Inc., Clifton, N. J., a corporation of Delaware Application November 19, 1952, Serial No. 321,406

7 Claims. (Cl. 250—40)

Figure 1:
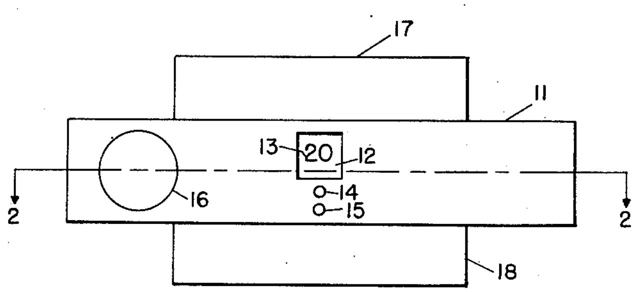

This invention relates to electrical tuning devices for converting radio frequency signals into lower or intermediate frequency signals, and particularly to tuners having a plurality of sets of tuned circuits, each set being tuned to a different predetermined frequency, and means for selectively electrically connecting the sets of tuned circuits to an active electrical circuit.

In electrical tuners it is difficult to achieve a large number of receiving channels using pre-tuned circuits and at the same time to achieve a physically compact structure. It also has been difficult to build tuners which are physically compact and which provide proper electrical isolation between certain circuits, such as the mixer circuit and oscillator circuit which are commonly employed in tuners of the superheterodyne type.

An object of the invention is to provide a tuner for television and radio frequencies which has a wide frequency-tuning range, which is physically compact, and which has desirable dimensions.

Other objects are to provide a tuning device having an oscillator circuit and a mixer circuit which are electrically isolated and shielded from each other, and to provide a tuner in which individual tuning circuits may be readily replaced or rearranged without the necessity of disassembling the tuning device. Other objects will be apparent.

Figure 2:
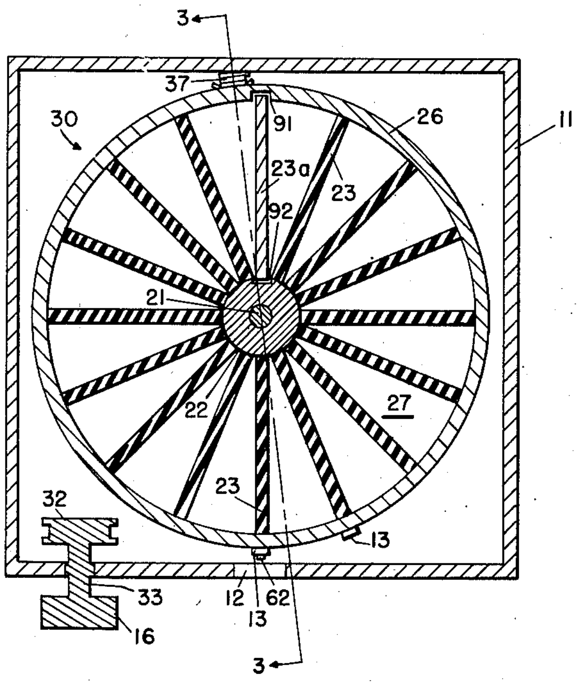
Figures 3, 4, 5, 6:
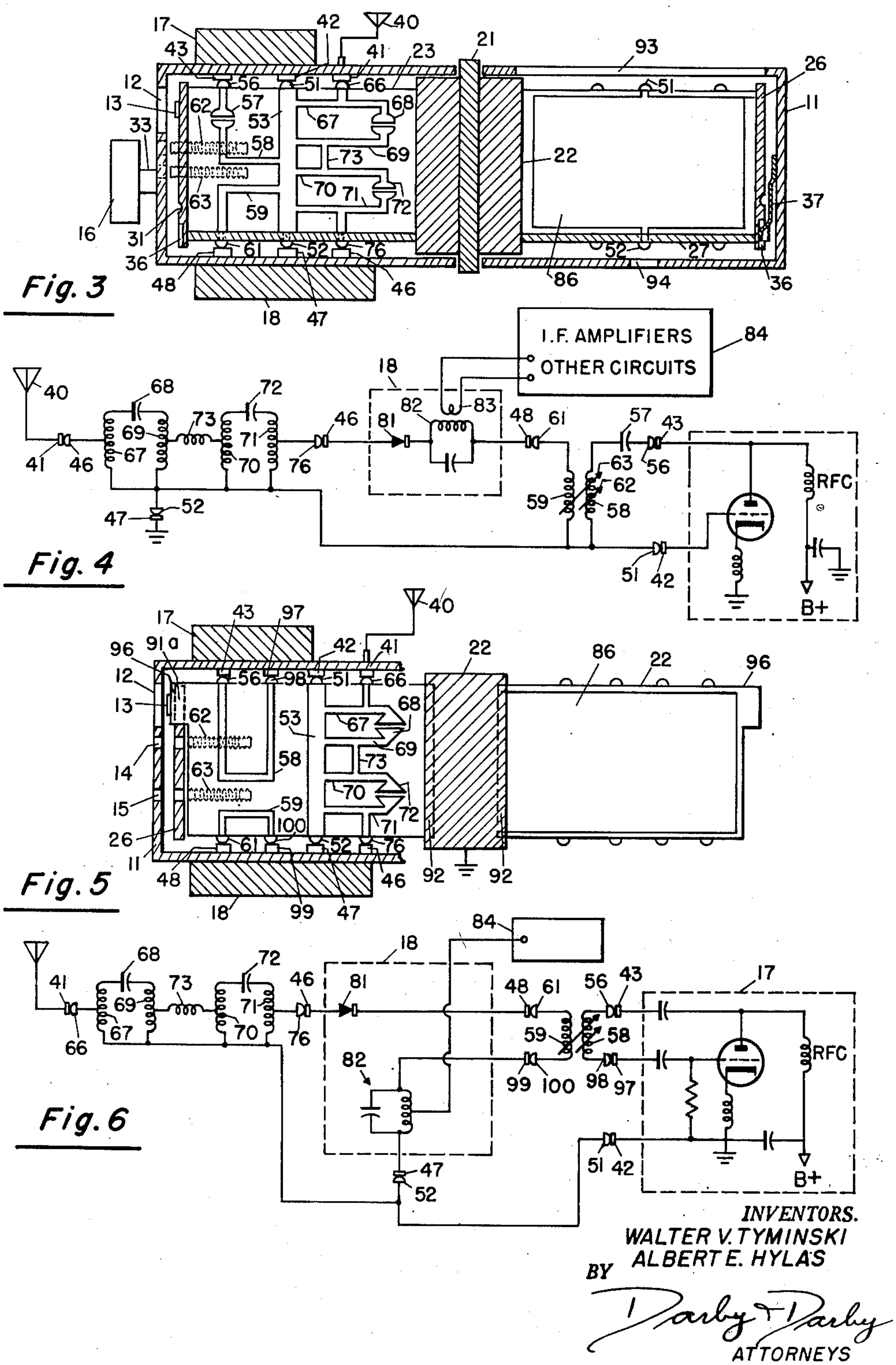

Referring to the drawing,

Figure 1 is a front view of a preferred embodiment of a tuning device in accordance with the invention, Figure 2 is a cross-sectional view of the device taken on the line 2—2 of Figure 1 showing internal construction features, Figure 3 is a cross-sectional view taken on the line 3—3 of Figure 2, showing details of a preferred embodiment of a tuning strip, Figure 4 is a schematic electrical circuit diagram of the preferred embodiment of the device, and Figures 5 and 6 show a modified physical layout and schematic diagram.

The preferred embodiment of the invention comprises a housing 11, preferably of metal, containing an opening 12 in the front thereof through which indicating indicia 13, such as frequency or television channel numbers, may be visually observed. Other openings, 14, 15 are provided in the front of the housing for occasional adjustment of oscillator tuning and coupling, as will be described hereafter. A tuning knob 16 is positioned in front of the housing 11, an oscillator circuit unit 17 on top, and a mixer circuit 18 on the bottom.

A spindle 21 is positioned within the housing 11 and is journalled in the top and bottom thereof, and a hub 22 is mounted concentrically on the spindle 21. Extending radially outwardly from the hub 22 are a plurality of tuning panels 23, each panel comprising an insulative member positioned to have a surface thereof parallel with the axis of the spindle 21. Electrical tuned circuits are positioned on these surfaces, as will be described. A rim 26 encircles the outer ends of the tuning panels 23, and a support disk 27 supports the bottom edges of the tuning panels 23 to lend rigidity to the rim 26 with respect to the hub 22. The disk 27 may have slots or holes to accommodate the bottom edges of the panels.

The assembly 30 comprising the spindle 21, hub 22, tuning panels 23, rim 26 and support disk 27, is rotatable about the axis of the spindle 21. Although the radially extending panels 23 preferably follow radii from the axis of rotation, they may be radially skewed if desired; that is, they may be angularly positioned with respect to the radii.

A circumferential groove 31 may be provided on the rim 26 into which a belt drive (not shown) may be positioned to drive the rotary tuning assembly 30 from a drive pulley 32 which is attached to the knob 16 through shaft 33. A plurality of detents 36 may be provided in the rim 26, corresponding in number to the number of tuning panels 23. A spring-like detent arm 37 may be attached to the housing 11 so as to resiliently and selectively engage the detents 36 when the rotatable assembly 30 is rotated, thereby aiding in positioning this assembly to the various tuning positions.

As shown in Figures 3 and 4, an antenna 40 may be connected to a fixed contact 41 which extends through a suitable opening in the housing 11. Other fixed contacts 42 and 43 extend through suitable openings in the housing 11 from the oscillator unit 17. Similarly, at the bottom of the housing 11, fixed contacts 46, 47 and 48 extend through suitable openings in the housing from the mixer unit 18. The groups of contacts 41, 42, 43 and 46, 47, 48, are arranged radially with respect to the spindle 21.

Electrical tuned circuits, which may be constructed in accordance with printed circuit techniques, are attached to a side of each of the tuning panels 23. The printed circuits terminate in a plurality of contact pins extending from the upper and lower edges of the tuning panels 23.

A preferred arrangement of the printed circuits will now be described. Referring jointly to Figures 3 and 4, contact pins 51 and 52 are positioned respectively at the top and bottom edges of the tuning panels; an electrically conductive strip 53 extends vertically along a side of the panel 23, the ends thereof respectively electrically engaging the contact pins 51 and 52. This serves as a common "ground" strip. The fixed contacts 42 and 47 function to make electrical connection to the grounding strip 53 at the top and bottom ends thereof. The ground strip 53 is sufficiently wide and thick to provide a good electrical path.

A contact pin 56 is positioned on the upper edge of the panel 23 to engage selectively the fixed electrical contact 43 of the oscillator unit. A condenser 57, which may be printed on the panel 23 in any conventional manner, has one terminal thereof connected to the pin 56, the remaining terminal of this condenser being connected to an inductance strip 58 which terminates in the ground strip 53. Another inductance strip 59 extends from the ground strip 53 in a position parallel to the inductance 58, the remaining end of the inductance 59 terminating in a contact pin 61 which is positioned at the bottom of the panel 23 so as to selectively engage the fixed contact 48 of the mixer circuit unit 18.

The inductive member 58 is a tunable element of the oscillator circuit 17. The oscillator frequency may be adjusted by turning screw 62, which is threaded lengthwise into the panel 23 near inductance 58 as shown in Figure 3. The opening 14 in the front of the housing 11 provides temporary adjustment access to the oscillator frequency adjusting screw 62.

A coupling screw 63 is threaded lengthwise into the panel 23 between the inductive members 58 and 59, whereby moving this member in and out will affect and adjust the electrical coupling between the inductive members 58 and 59. The opening 15 in the housing 11 provides temporary access to the screw member 63 for adjustment purposes.

A contact pin 66 is positioned on the upper edge of the panel 23 so as to selectively engage the antenna contact 41. An inductive member 67 extends outwardly from the grounding strip 53 and terminates at a condenser 68. The contact pin 66 is electrically connected to the inductance 67 at a point intermediate along the length thereof.

Another inductance strip 69 extends from the ground strip 53 in parallel relationship to the inductance 67 and terminates at the remaining terminal of the condenser 68. Another pair of inductances 70 and 71 extend outwardly from the ground strip 53 in a parallel fashion and terminate respectively at the terminals of a condenser 72. A coupling inductance 73 extends vertically between the inductances 69 and 70 and terminates in these inductances at points intermediate the ends thereof. A contact pin 76 is positioned at the bottom edge of the panel 23 so as to selectively engage the fixed contact 46. An electrical connection is made between the contact pin 76 and a point intermediate along the length of the inductance 71.

The inductance values of the strips 58, 59, 67, 69, 70, 71, 73, depends on their widths, thicknesses and lengths. These inductances can be factory-trimmed by scraping to make them thinner or narrower, or by painting with a conductive paint to make them wider or thicker.

As will be seen in Figure 4, the mixer circuit unit 18 may comprise a diode detector 81, one end of which is connected to the fixed contact terminal 46, the other end being connected through a tuned circuit 82 to the fixed contact terminal 48. Thus, the incoming radio frequency signal after passing through the preselector or mixer circuits is connected through the fixed terminal 46 to the mixer diode 81, and the oscillating energy from the oscillator circuit unit 17 is connected through the fixed contact terminal 48 to the tuned circuit 82. Circuit 82 is preferably tuned to the intermediate frequency of a radio or television receiver or other device 84. A link coupling 83 connects the output from the mixer circuit unit 18 to the intermediate frequency circuits, and in turn to other circuits, in the device 84.

For shielding purposes between the various tuning panels 23, the back sides of these panels (the printed circuits being attached to the front sides thereof) may have attached thereto a conductive shield member 86 which is connected to the grounding terminal pins 51 and 52. Each of the tuning panels 23 may have a circuit attached thereto substantially as has been described, or may have different sorts of circuits printed on or otherwise attached thereto. Any desired number of tuning panels may be employed. To facilitate a large number of panels, each panel may be tapered so as to be narrower at its hub end.

To facilitate removal and rearrangement of the various tuning panels 23, these panels may be positioned in slots 91, 92 in the rim 26 and in the hub 22, as is shown in Figure 2, in connection with the tuning member 23*a*. A suitable opening 93 may be provided in the top of the housing 11 as shown in Figure 3 through which the various tuning panels 23 may be removed or inserted, one or more at a time, from or into the various slots 91, 92. The opening 93 may comprise a narrow slit which will not adversely affect the shielding characteristic of the housing 11. Another opening 94 may be provided in the bottom of the housing 11, through which an object may be temporarily inserted to push a panel 23 upwardly through the opening 93.

In operation of the novel tuner, the knob 16 is turned, thereby rotating the tuning assembly 30, whereby the different tuned circuits on the panels 23, which are pretuned to various desired frequencies, are selectively connected to the oscillator and mixed circuits. The various indicator indicia 13 may indicate television channel numbers or radio frequencies corresponding to the various television channels or radio frequencies to which the tuned circuits are tuned.

The invention is particularly suitable for ultra high frequencies, such as are used in the UHF television band, and for combined VHF and UHF tuners and converters. The tuned circuits may be easily and inexpensively printed onto the surfaces of the tuning panels 23. The grounding strip 53 functions, in addition to being a grounding strip, as a shield between the printed oscillator tuned circuit and the printed mixer circuits, thus providing electrical isolation between these circuits and preventing undesired interaction. The oscillator and mixer circuit units, being mounted at the top and bottom of the tuning assembly, are electrically isolated from each other, so that the only electrical coupling between the oscillator and mixer will be the desired coupling provided through the contact pin 61 and fixed contact 48. Thus the amount of coupling will be individually and accurately adjusted by means of the coupling screw 63.

In the modification shown in Figure 5, transverse slots 91*a* are provided in the rim 26. The panels 23 are provided with a projection tab 96 which fits into the slots 91*a*. The indicia or TV channel number 13 is affixed to the end of the tab 96 so as to be visible through the opening 12. Thus, when the panels 23 are rearranged in the rotatable assembly 30, the indicia will be in the correct positions.

As shown in Figure 5, the hub 22 may be of conductive material electrically grounded, and the shield 86 may extend into or against the hub, to provide complete shielding between panels.

At extremely high frequencies, the grounding strip 53 may have sufficient inductance to provide a common-path coupling between the oscillator and mixer tuned circuits. The modification of Figures 5 and 6 avoid this undesired coupling, and provides improved circuit isolation, by connecting the oscillator tuning and coupling coils 58 and 59 to their respective circuits through extra sets of contacts, 97, 98, 99, 100 rather than through the grounding strip 53. However, the grounding strip 53 still acts as a shield between the oscillator and mixer tuned circuits.

While a preferred embodiment of the invention has been shown and described, it will be apparent to those skilled in the art that various modifications may be made within the scope of the invention. The invention is defined by the followings claims.

What is claimed is:

1. An electrical tuner comprising a hub and a rim concentrically positioned on an axis and rotatable in unison about said axis, a longitudinal slot on the outer surface of said hub, a longitudinal slot on the inner surface of said rim, a panel of insulative material removably positioned in said slots and having a surface radiating from and parallel to said axis, and an electrical circuit positioned on said surface of said panel.

2. An electrical tuner comprising an assembly rotatable about an axis, said assembly comprising an insulative panel having a radial surface parallel to and radiating from said axis and having edges disposed laterally with respect to said axis and bounding said surface on two opposite sides thereof, an electrical circuit positioned on said surface, contact pins respectively positioned at said edges and electrically connected to said circuit, and a plurality of fixedly positioned electrical circuits positioned respectively near said edges and having fixed electrical contacts positioned to respectively engage said contact pins simultaneously and selectively when said assembly is rotated.

3. The tuner in accordance with claim 2, in which said fixedly positioned circuits are selectively electrically coupled together through said circuit positioned on said surface.

4. The tuner in accordance with claim 2, in which said circuit on said surface comprises a portion adapted to be connected to and affect one of said fixedly positioned circuits and another portion adapted to be connected to and affect another of said fixedly positioned circuits, and a shielding member positioned on said surface between said portions of said circuit.

5. The tuner in accordance with claim 4, in which said shielding member is at electrical ground potential and provides a common grounding point for said portions of said circuit on said surface.

6. An electrical circuit comprising an insulative member having a substantially planar surface, a thin strip-like shielding member positioned on said surface and connected to electrical ground potential, an oscillator tuning element of the planar printed circuit type positioned on said surface on one side from said shielding member and insulated therefrom, and a mixer tuning element of the planar printed-circuit type positioned on said surface on the other side from said shielding member and electrically connected thereto, said shielding member and said tuning elements extending substantially the same distance outwardly from said surface, said shielding member providing an electrical ground connection to said mixer tuning element.

7. An electrical tuner comprising a housing, an assembly in said housing and rotatable about an axis, said assembly having a plurality of insulative members having surfaces radiating from and parallel to said axis, planar printed circuit type tuned electrical circuits respectively positioned on said surfaces, a fixedly positioned electrical circuit, means to selectively engage said tuned circuits with said fixedly positioned circuit when said assembly is rotated, a plurality of scale indicia positioned on said assembly corresponding respectively to the angular position of said radial surface, a first opening in said housing through which said scale indicia are selectively visible and a tuning adjustment member movably positioned in said assembly in the electric field of one of said tuned circuits and movable in a direction parallel to the plane of said tuned circuit, and a second opening in said housing through which a tool may be temporarily inserted to move said adjustment member.

References Cited in the file of this patent

UNITED STATES PATENTS

| | | |
|---|---|---|
| 1,958,282 | Tregenza | May 8, 1934 |
| 2,078,909 | Gunther | Apr. 27, 1937 |
| 2,469,941 | Abrams | May 10, 1949 |
| 2,474,988 | Sargrove | July 5, 1949 |
| 2,545,681 | Zepp et al. | Mar. 20, 1951 |
| 2,611,807 | Lazzery | Sept. 23, 1952 |
| 2,672,555 | Ehrbar | Mar. 16, 1954 |
| 2,695,963 | Thias | Nov. 30, 1954 |
| 2,698,388 | Cage | Dec. 28, 1954 |